US012765377B2

(12) United States Patent
Wang

(10) Patent No.: US 12,765,377 B2
(45) Date of Patent: Oct. 13, 2026

(54) CIRCUIT BOARD

(71) Applicants: QingDing Precision Electronics (Huai'an) Co., Ltd., Jiangsu Province (CN); Avary Holding (Shenzhen) Co., Ltd., Shenzhen (CN); Garuda Technology Co., Ltd., New Taipei City (TW)

(72) Inventor: Hao Wang, Jiangsu Province (CN)

(73) Assignees: QingDing Precision Electronics (Huai'an) Co., Ltd., Jiangsu Province (CN); Avary Holding (Shenzhen) Co., Ltd., Shenzhen (CN); Garuda Technology Co., Ltd., New Taipei City (TW)

( * ) Notice: Subject to any disclaimer, the term of this patent is extended or adjusted under 35 U.S.C. 154(b) by 442 days.

(21) Appl. No.: 18/455,066

(22) Filed: Aug. 24, 2023

(65) Prior Publication Data

US 2025/0038068 A1 Jan. 30, 2025

(30) Foreign Application Priority Data

Jul. 24, 2023 (CN) ......................... 202310914504.3

(51) Int. Cl.
*H10W 40/28* (2026.01)
*H10N 19/00* (2023.01)
(Continued)

(52) U.S. Cl.
CPC ............ *H10W 40/28* (2026.01); *H10N 19/00* (2023.02); *H10W 72/073* (2026.01); (Continued)

(58) Field of Classification Search
CPC . H10W 40/28; H10W 72/073; H10W 72/075; H10W 72/354; H10W 72/884;
(Continued)

(56) References Cited

U.S. PATENT DOCUMENTS 6,288,343 B1 * 9/2001 Ahn .................... H05K 3/4691 174/254
2005/0062147 A1 3/2005 Wakisaka et al.
(Continued)

FOREIGN PATENT DOCUMENTS

CN 105338738 B 9/2018
CN 211905186 U * 11/2020
(Continued)

*Primary Examiner* — Norman D Richards
*Assistant Examiner* — Azm Parvez
(74) *Attorney, Agent, or Firm* — MUNCY, GEISSLER, OLDS & LOWE, P.C.

(57) ABSTRACT

A circuit board includes a main board, a thermistor layer, a plurality of n-type semiconductor units and a plurality of p-type semiconductor units. The main board includes a first external structure, a second external structure, and an internal structure disposed between the first external structure and the second external structure. The internal structure includes a first internal circuit layer, a second internal circuit layer, and an insulating layer disposed between the first internal circuit layer and the second internal circuit layer. The thermistor layer is disposed on the insulating layer and the first internal circuit layer. The n-type semiconductor units and the p-type semiconductor units are electrically connected to the second internal circuit layer and the second external structure, in which the n-type semiconductor units and the p-type semiconductor units are alternately arranged in one direction.

9 Claims, 6 Drawing Sheets

(51) Int. Cl.
*H10W 72/00* (2026.01)
*H10W 72/30* (2026.01)
*H10W 90/00* (2026.01)

(52) U.S. Cl.
CPC ........ *H10W 72/075* (2026.01); *H10W 72/354* (2026.01); *H10W 72/884* (2026.01); *H10W 90/732* (2026.01); *H10W 90/752* (2026.01)

(58) Field of Classification Search
CPC .. H10W 90/732; H10W 90/752; H10N 19/00; H05K 1/0201; H05K 1/02; H05K 3/0011
USPC ......................................... 257/431, 428, 414
See application file for complete search history.

(56) References Cited

U.S. PATENT DOCUMENTS

| | | | |
|---|---|---|---|
| 2010/0219525 | A1 | 9/2010 | Ibaraki |
| 2022/0181287 | A1 | 6/2022 | Ito |

FOREIGN PATENT DOCUMENTS

| | | | | | |
|---|---|---|---|---|---|
| CN | 110996491 | B | | 3/2021 | |
| CN | 114792666 | A | | 7/2022 | |
| CN | 115113463 | A | * | 9/2022 | ............... H05K 7/20 |
| CN | 116230667 | A | | 6/2023 | |
| JP | H05243621 | A | * | 9/1993 | |
| JP | H1140692 | A | | 2/1999 | |
| JP | 2008211254 | A | | 9/2008 | |
| KR | 10-2014-0132970 | A | | 11/2014 | |
| KR | 10-2015-0146365 | A | | 12/2015 | |
| WO | WO-2015005362 | A1 | * | 1/2015 | ........... H10N 10/817 |
| WO | WO2021253573 | A1 | | 12/2021 | |

* cited by examiner

CIRCUIT BOARD

CROSS-REFERENCE TO RELATED APPLICATION

This application claims priority to China Application Serial Number 202310914504.3, filed Jul. 24, 2023, which is herein incorporated by reference.

BACKGROUND

Field of Invention

The present invention relates to a circuit board and a manufacturing method thereof, and particularly relates to a circuit board with a refrigeration structure and its manufacturing method.

Description of Related Art

With the development of semiconductor technology, an image quality of an image sensor is getting better and better, but the required power consumption increases accordingly, so that the energy required for heat dissipation also increases. If the heat dissipation problem of the image sensor cannot be effectively solved, it may cause hot pixels, thereby destroying the image quality.

If merely using a metal layer under the image sensor for heat dissipation, the power consumption of the image sensor cannot be effectively dissipated when the image sensor works for a long time or provides a higher image quality. In view of the above, there is a need to develop a circuit board that can effectively dissipate heat to overcome the above disadvantages.

SUMMARY

At least one embodiment of the present invention provides a circuit board with a refrigeration structure and a manufacturing method thereof, in which the refrigeration structure can provide cold ends to remove heat energy from an image sensor. Therefore, the heat energy of the circuit board can be effectively dissipated.

The circuit board provided by at least one embodiment of the present invention includes a main board, a first bonding layer, a second bonding layer, a thermistor layer, a plurality of N-type semiconductor units, and a plurality of P-type semiconductor units. The main board includes a first external structure, a second external structure, and an internal structure. The internal structure is disposed between the first external structure and the second external structure, in which the internal structure, the first external structure, and the second external structure are stacked along a first direction. The internal structure includes a first internal circuit layer, a second internal circuit layer, and an insulating layer. The insulating layer is disposed between the first internal circuit layer and the second internal circuit layer, in which the insulating layer, the first internal circuit layer, and the second internal circuit layer are stacked along the first direction. The first bonding layer is disposed between the internal structure and the first external structure, in which the first bonding layer connects to the internal structure and the first external structure. The second bonding layer is disposed between the internal structure and the second external structure, in which the second bonding layer connects to the internal structure and the second external structure. The thermistor layer is embedded in the first bonding layer and disposed on the insulating layer and the first internal circuit layer. The N-type semiconductor units and the P-type semiconductor units are embedded in the second bonding layer and electrically connect to the second internal circuit layer and the second external structure, in which the N-type semiconductor units and the P-type semiconductor units alternately arrange along a second direction perpendicular to the first direction, and an orthogonal projection of the N-type semiconductor units and the P-type semiconductor units on the insulating layer overlaps an orthogonal projection of the thermistor layer on the insulating layer.

In at least one embodiment of the present invention, the second internal circuit layer includes a plurality of cold ends, and the second external structure includes a plurality of hot ends, in which an ith N-type semiconductor unit is adjacent to an ith P-type semiconductor unit, the ith N-type semiconductor unit and the ith P-type semiconductor unit connect to a same cold end, and an ith P-type semiconductor unit and a (i+1)th N-type semiconductor unit connects to a same hot end, where i is a positive integer.

In at least one embodiment of the present invention, N-type semiconductor units and P-type semiconductor units connect to the second external structure.

In at least one embodiment of the present invention, the circuit board further includes a thermal conductive layer and a dissipation reinforcing layer. The thermal conductive layer is disposed on the second external structure, in which the thermal conductive layer connects to the second external structure and the second bonding layer. The dissipation reinforcing layer is disposed on the thermal conductive layer.

In at least one embodiment of the present invention, the circuit board further includes a thermal conductive layer and an image sensor. The thermal conductive layer is disposed on the thermistor layer. The image sensor is disposed on the thermal conductive layer.

In at least one embodiment of the present invention, a protruding portion of the internal structure protrudes from a sidewall of the first external structure and a sidewall of the second external structure, in which the main board further includes a first cover layer and a second cover layer. The first cover layer covers the protruding portion of the internal structure. The second cover layer covers the protruding portion of the internal structure. The circuit board further includes an extending board, in which the extending board electrically connects to the protruding portion of the internal structure.

In at least one embodiment of the present invention, the extending board comprises a data processor and a driving circuit.

In at least one embodiment of the present invention, the circuit board further includes a solder mask layer disposed on the first external structure and on the second external structure.

In at least one embodiment of the present invention, the circuit board further includes a protecting layer on the first external structure, in which the protecting layer includes a nickel-gold layer.

At least one embodiment of the present invention provides a manufacturing method of a circuit board comprising the following operations. An internal structure is provided, in which the internal structure includes a first internal circuit layer, a second internal circuit layer, and an insulating layer disposed between the first internal circuit layer and the second internal circuit layer, in which the insulating layer, the first internal circuit layer, and the second internal circuit layer stack along a first direction; a thermistor layer is formed on the first internal circuit layer, in which the thermistor layer connects to the insulating layer and the first internal circuit layer; a first peelable glue layer is formed on the thermistor layer; a first bonding layer is formed on the first internal circuit layer, in which the first bonding layer encapsulates the first peelable glue layer and the thermistor layer; a second bonding layer is formed on the second internal circuit layer, in which the second bonding layer includes a plurality of recesses, the recesses expose the second internal circuit layer, and an orthogonal projection of the recesses on the insulating layer overlaps an orthogonal projection of the thermistor layer on the insulating layer; a N-type semiconductor material and a P-type semiconductor material are filled in the recesses to form N-type semiconductor units and P-type semiconductor units, in which the N-type semiconductor units and the P-type semiconductor units alternately arrange along a second direction perpendicular to the first direction; a first external structure is formed on the first bonding layer; a second external structure is formed on the second bonding layer, such that the second external structure electrically connects to the N-type semiconductor units and the P-type semiconductor units; and the first peelable glue layer and a portion of the first bonding layer located above the first peelable glue layer are removed, and the thermistor layer is exposed.

In at least one embodiment of the present invention, the manufacturing method of the circuit board further includes: a thermal conductive layer is formed on the thermistor layer.

In at least one embodiment of the present invention, the manufacturing method of the circuit board further includes: an image sensor is disposed on the thermistor layer; a thermal conductive layer is formed on the second external structure, in which the thermal conductive layer connects to the second external structure and the second bonding layer; a dissipation reinforcing layer is formed on the thermal conductive layer.

In at least one embodiment of the present invention, the manufacturing method of the circuit board further includes: after the image sensor is disposed, bonding wires are formed above the image sensor, such that the image sensor is electrically connected to the first external structure.

In at least one embodiment of the present invention, the manufacturing method of the circuit board further includes: a first cover layer is formed on first internal circuit layer, in which the first cover layer separates from the thermistor layer; a second cover layer is formed on the second internal circuit layer, in which the second cover layer separates from the recesses, and an orthogonal projection of the first cover layer on the insulating layer overlaps an orthogonal projection of the second cover layer on the insulating layer; a second peelable glue layer is formed on the first cover layer, in which in the operation of forming the first bonding layer, the first bonding layer further encapsulates the second peelable glue layer and the first cover layer; a third peelable glue layer is formed on the second cover layer, in which in the operation of forming the second bonding layer, the second bonding layer further encapsulates the third peelable glue layer and the second cover layer; a second peelable glue layer is removed to expose the first cover layer; and a third peelable glue layer is removed to expose the second cover layer.

In at least one embodiment of the present invention, the manufacturing method of the circuit board further includes: after the first bonding layer and the second bonding layer are formed, a plated-through hole is formed.

In at least one embodiment of the present invention, the manufacturing method of the circuit board further includes: after the through-hole is formed, a solder mask layer is formed in the plated-through hole and on the first external structure and the second external structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
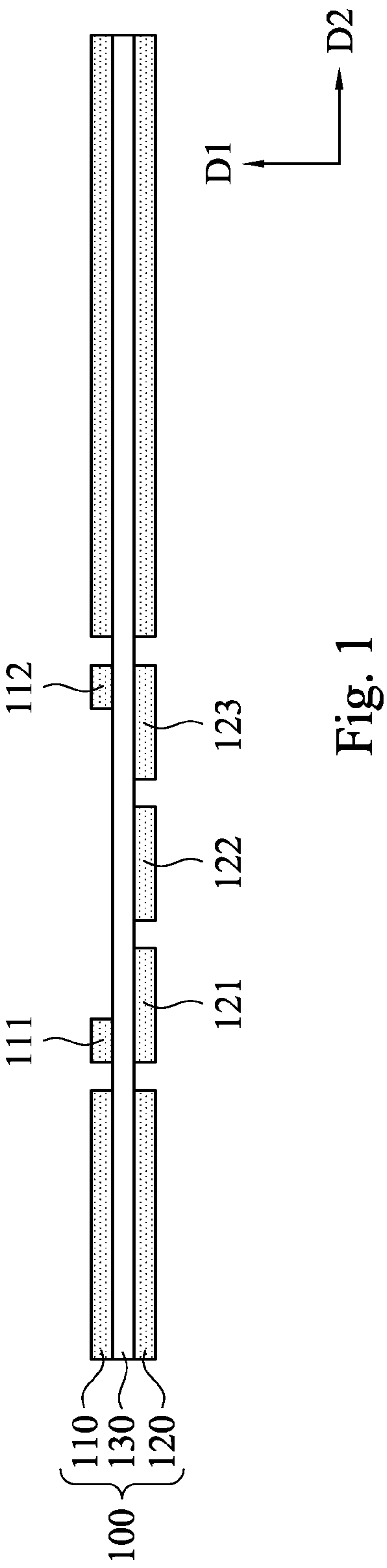
FIG. 1 to FIG. 8 are cross-sectional views of a circuit board at various stages of a manufacturing process in accordance with at least one embodiment of the present invention.

In the following text, in order to clearly present the technical features of the present disclosure, the dimensions (such as lengths, widths, thicknesses and depths) of the components (such as insulating layers, circuit layers, and through-holes, etc.) in the drawings may be enlarged in a non-proportional manner, and the number of some components may be reduced. Therefore, the description and explanation of the following embodiments are not limited to the number of components in the drawings and the size and shape of the components, but should cover the deviations in sizes, shapes and both caused by actual manufacturing processes and/or tolerances. For example, a planar surface shown in the drawings may have rough and/or non-linear features, while acute angles shown in the drawings may be rounded. Therefore, the components shown in the drawings of the present disclosure are mainly for illustration, and are not intended to accurately depict the actual shapes of the components, nor are used to limit the scope of the patent application of the present disclosure.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. That is, when the device is oriented differently from the drawings (rotated 90 degrees or at other orientations), the spatially relative terms used in the present disclosure may also be interpreted accordingly.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term “and/or” includes any and all combinations of one or more of the associated listed items.

As used herein, “about”, “approximately”, “essentially”, or “substantially” can be used according to optical properties, etching properties, mechanical properties, measurement properties, coating properties or other properties. Accepted deviation ranges or standard deviations are selected, instead of one standard deviation for all properties. It should be noted that a first direction D1 and a second direction D2 are labeled in the drawings to present the configuration relationship of the components in the drawings, and the first direction D1 and the second direction D2 are substantially perpendicular to each other.

FIG. 1 to FIG. 8 are cross-sectional views of a circuit board 800 at various stages of a manufacturing process in accordance with at least one embodiment of the present invention. Referring to FIG. 1, an internal structure 100 includes a first internal circuit layer 110, a second internal circuit layer 120, and an insulating layer 130 disposed between the first internal circuit layer 110 and the second internal circuit layer 120. The insulating layer 130, the first internal circuit layer 110, and the second internal circuit layer 120 are stacked along the first direction D1.

As shown in FIG. 1, the first internal circuit layer 110 includes electrodes 111 and 112, and the electrodes 111 and 112 are spaced apart from each other. The second internal circuit layer 120 includes a plurality of cold ends 121, 122, and 123, and the cold ends 121, 122, and 123 are spaced apart from each other. The electrodes 111 and 112 and the cold ends 121, 122, and 123 are respectively disposed on opposite sides of the insulating layer 130. It is understood that both of the electrodes 111 and 112 are metal pads (or metal layers) of the first internal circuit layer 110 at this stage, and all of the cold ends 121, 122, and 123 are metal pads of the second internal circuit layer 120 at this stage.

In some embodiments, a material of the insulating layer 130 may be an insulating material such as, polyimide (PI), glass fiber epoxy resin (FR4), polyethylene terephthalate (PET), polyethylene naphthalate (PEN), or polyethylene (PE), but is not limited thereto.

In the present embodiment, the first internal circuit layer 110 and the second internal circuit layer 120 are formed by first forming a dry film, and then exposed and developed. Therefore, the first internal circuit layer 110 and the second internal circuit layer 120 are formed by a subtractive process. However, in other embodiments, the first internal circuit layer 110 and the second internal circuit layer 120 may be formed by a semi-additive process or an additive process. In some embodiments, a material of the first internal circuit layer 110 and/or second internal circuit layer 120 may be a conductive material such as copper, gold, or silver, but is not limited thereto.

Figure 2:
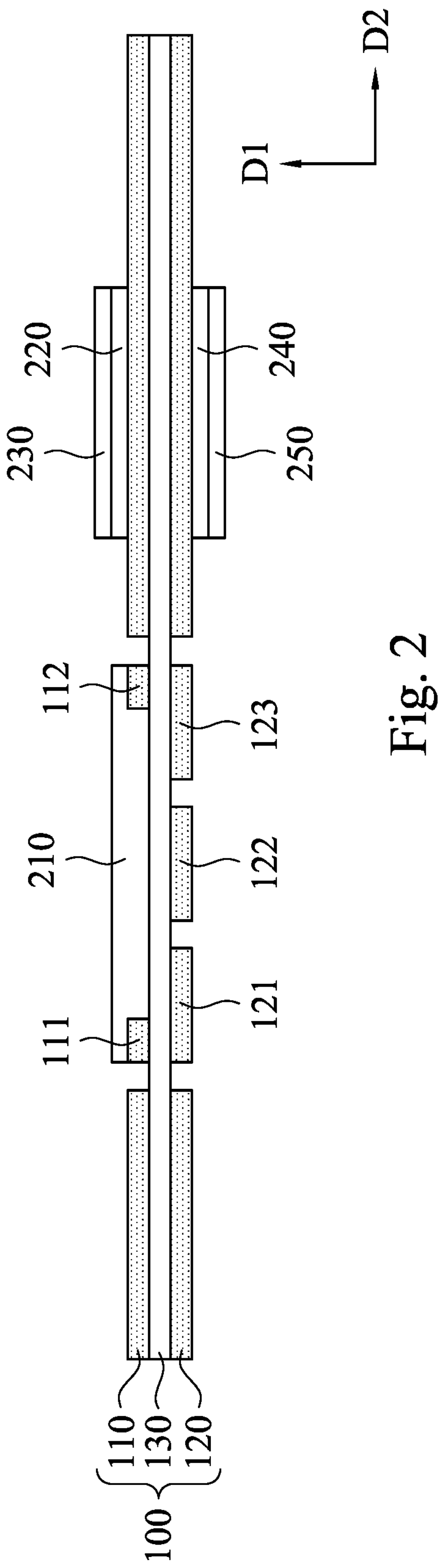

Referring to FIG. 2, a thermistor layer 210 is formed on the first internal circuit layer 110, in which the thermistor layer 210 connects to the electrodes 111 and 112 of the first internal circuit layer 110 and the insulating layer 130. In some embodiments, a material of the thermistor layer 210 may be a material of a negative temperature coefficient thermistor (NTC) or a material of a positive temperature coefficient thermistor (PTC).

As shown in FIG. 2, a first adhesive layer 220 and a first cover layer 230 are further disposed on the first internal circuit layer 110, in which the first cover layer 230 separates from the thermistor layer 210. A second adhesive layer 240 and a second cover layer 250 are further disposed on the second internal circuit layer 120. Since the first cover layer 230 and the second cover layer 250 are respectively disposed on opposite sides of the insulating layer 13, an orthogonal projection of the first cover layer 230 on the insulating layer 130 overlaps an orthogonal projection of the second cover layer 250 on the insulating layer 130. In the present embodiment, the first cover layer 230 and the second cover layer 250 are disposed by laminating processes.

Figure 3:
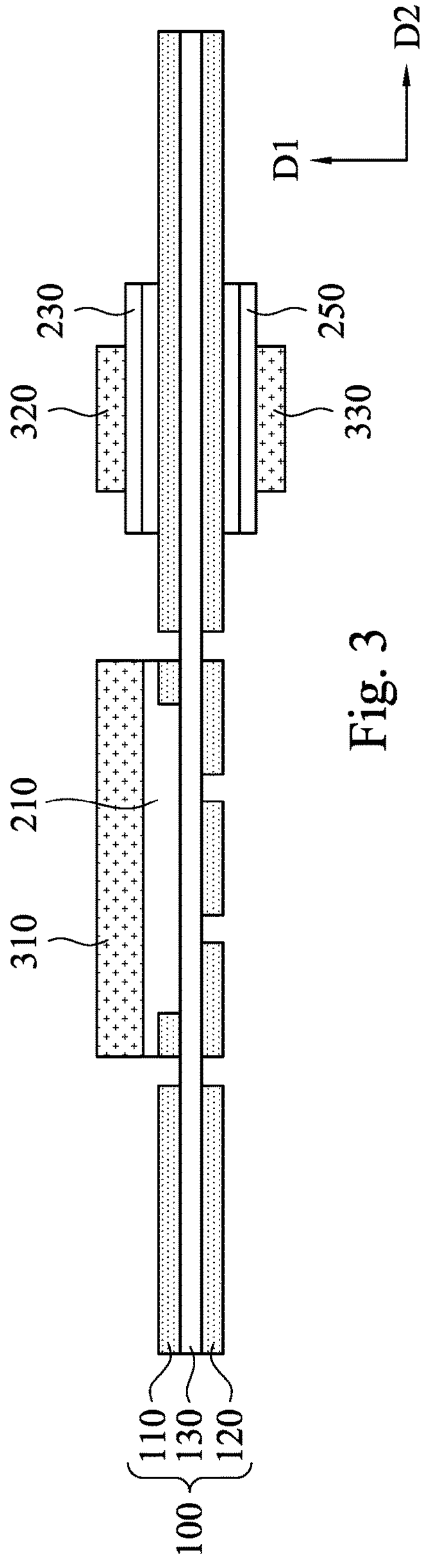

Referring to FIG. 3, a first peelable glue layer 310 is formed on the thermistor layer 210, a second peelable glue layer 320 is formed on the first cover layer 230, and a third peelable glue layer 330 is formed on the second cover layer 250. In the present embodiment, the first peelable glue layer 310, the second peelable glue layer 320, and the third peelable glue layer 330 are disposed by laminating processes. In the present embodiment, a width of the first peelable glue layer 310 in the second direction D2 substantially equals to a width of the thermistor layer 210 in the second direction D2. In the present embodiment, a width of the second peelable glue layer 320 in the second direction D2 is smaller than a width of the first cover layer 230 in the second direction D2, and a width of the third peelable glue layer 330 in the second direction D2 is smaller than a width of the second cover layer 250 in the second direction D2.

Figure 4:
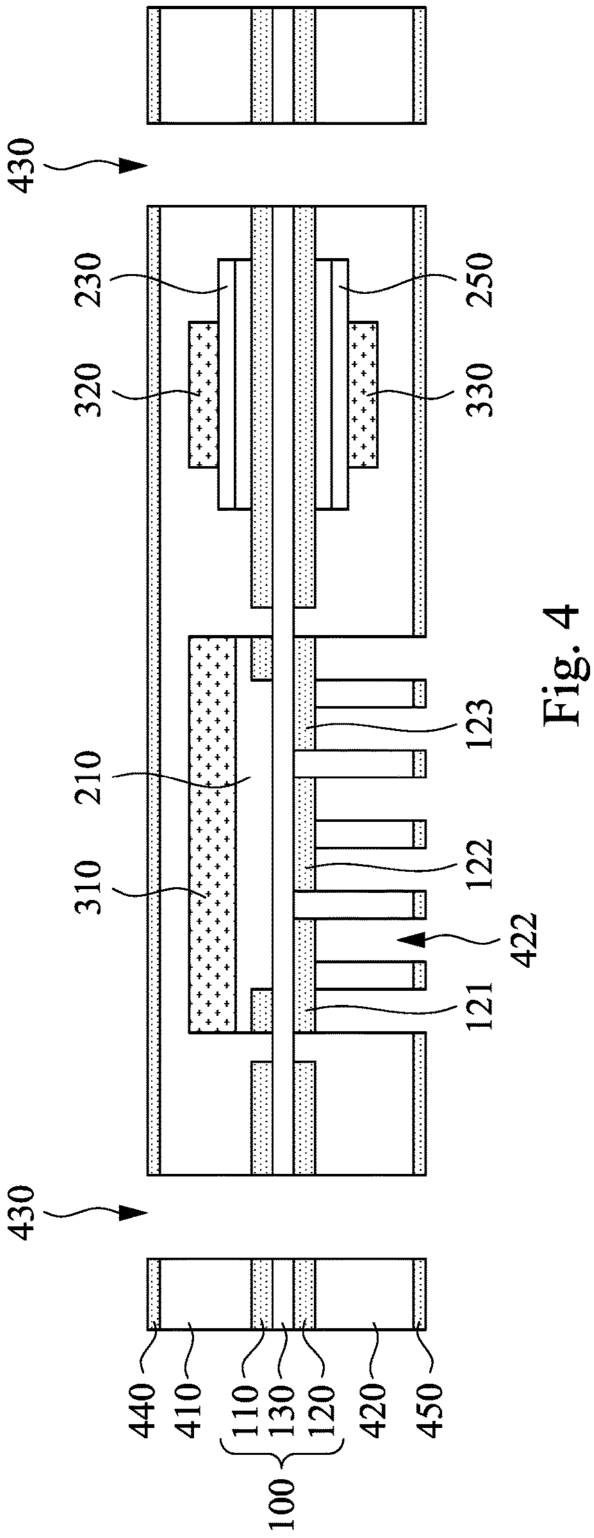

Referring to FIG. 4, a first bonding layer 410 is formed on the first internal circuit layer 110, in which the first bonding layer 410 encapsulates the first peelable glue layer 310 and the thermistor layer 210. A second bonding layer 420 is formed on the second internal circuit layer 120, in which the second bonding layer 420 includes a plurality of recesses 422 arranged along the second direction D2, and the recesses 422 expose the cold ends 121, 122, and 123 of the second internal circuit layer 120. As shown in FIG. 4, since the recesses 422 are disposed on the cold ends 121, 122, and 123 of the second internal circuit layer 120, an orthogonal projection of the recesses 422 on the insulating layer 130 overlaps an orthogonal projection of the thermistor layer 210 on the insulating layer 130.

As shown in FIG. 4, the first bonding layer 410 further encapsulates the second peelable glue layer 320 and the first cover layer 230, and the second bonding layer 420 further encapsulates the third peelable glue layer 330 and the second cover layer 250. In the present embodiment, the first bonding layer 410 and the second bonding layer 420 are disposed by laminating and pressing. In the present embodiment, materials of the first bonding layer 410 and the second bonding layer 420 may be low flow prepreg or non-flow prepreg.

As shown in FIG. 4, a metal layer 440 is formed on the first bonding layer 410, and the metal layer 450 is formed on the second bonding layer 420. After the aforementioned first bonding layer 410, second bonding layer 420, metal layer 440, and metal layer 450 are formed, a plurality of through-holes 430 are formed. In the present embodiment, the through-holes 430 may be formed using a mechanical drilling method or a laser drilling method.

Figure 5:
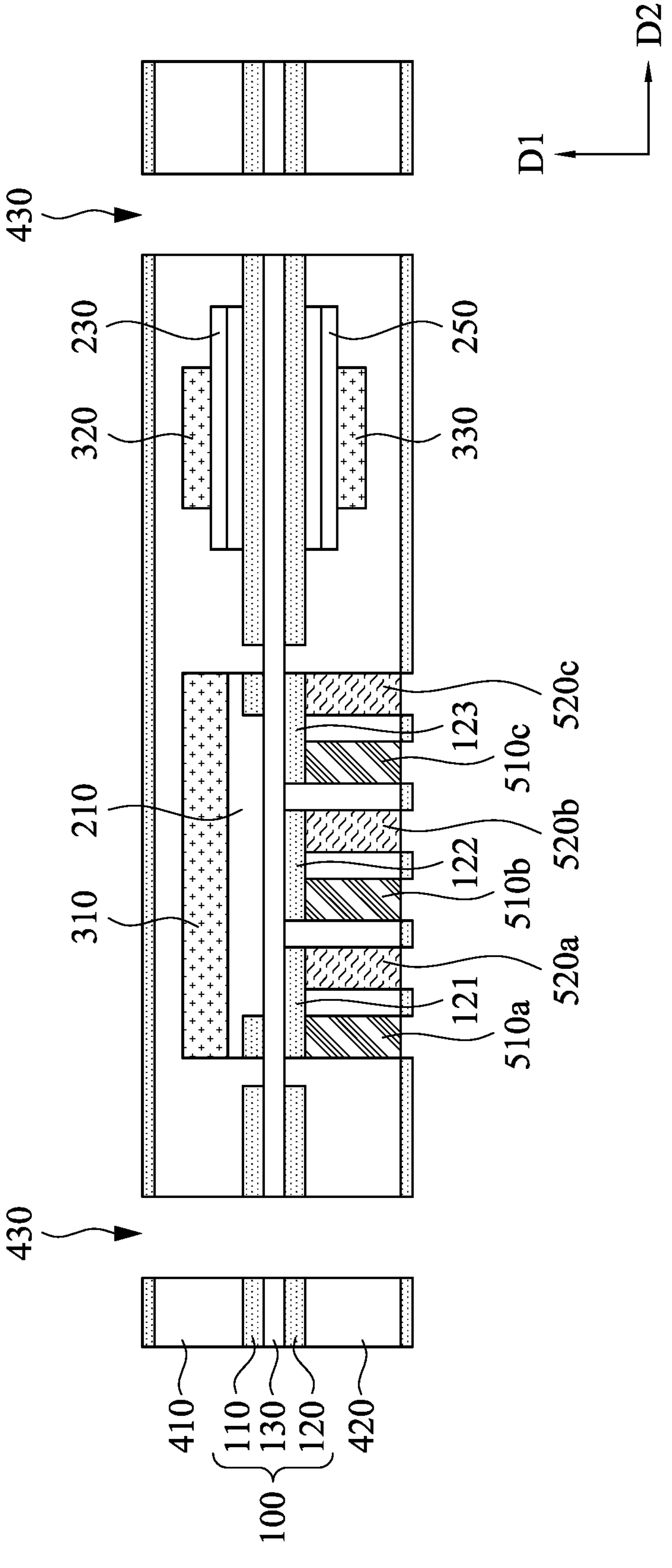

Referring to FIG. 5, a N-type semiconductor material and a P-type semiconductor material are filled into the recesses 422 (referring to FIG. 4) to formed a plurality of N-type semiconductor units 510*a*, 510*b*, and 510*c* and a plurality of P-type semiconductor units 520*a*, 520*b*, and 530*c*, in which an orthogonal projection of the P-type semiconductor units 520*a*, 520*b*, and 530*c* on the insulating layer 130 overlaps an orthogonal projection of the thermistor layer 210 on the insulating layer 130.

N-type semiconductor units 510*a*, 510*b*, and 510*c* and P-type semiconductor units 520*a*, 520*b*, and 530*c* alternately arrange along the second direction D2. Taking FIG. 5 as an example, a first N-type semiconductor unit 510*a* is adjacent to a first P-type semiconductor unit 520*a*, a second N-type semiconductor unit 510*b* is adjacent to a second P-type semiconductor unit 520*b*, and a third N-type semiconductor unit 510*c* is adjacent to a third P-type semiconductor unit 520*c*. Therefore, an ith N-type semiconductor unit (such as the first N-type semiconductor unit 510*a*) would be adjacent to an ith P-type semiconductor unit (such as the first P-type semiconductor unit 520*a*), where i is a positive integer.

In the present embodiment, the N-type semiconductor material is filled into portions of the recesses 422 by using a printing process, and then the N-type semiconductor material is baked to form N-type semiconductor units 510*a*, 510*b*, and 510*c*. After that, the P-type semiconductor material is filled into the remaining portions of the recesses 422 by using a printing process, and then the P-type semiconductor material is baked to form the P-type semiconductor units 520*a*, 520*b*, and 530*c*. N-type semiconductor is the semiconductor in which the electron density in the conduction band is greater than the hole density in the valence band, such that the N-type semiconductor material is formed by adding acceptor impurities (for example, doping arsenic or phosphorus) to the crystal structure of silicon. P-type semiconductor is the semiconductor in which the hole density in the conduction band greater than the electron density in the valence band, such that the P-type semiconductor material is formed by adding acceptor impurities (for example, boron doping) to the crystal structure of silicon. In some embodiments, the N-type semiconductor material and the P-type semiconductor material may be bismuth antimony telluride alloys, bismuth telluride, lead telluride, silicon germanium, or skutterudite. In the present example, the N-type semiconductor material may be $Bi_2Sb_{2.7}Te_{0.3}$, and the P-type semiconductor material may be BiSbTe.

It is understood that one N-type semiconductor unit and the adjacent P-type semiconductor unit form a pair of thermocouples. FIG. 5 illustrates three pairs of thermocouples (i.e., a pair of the N-type semiconductor unit 510*a* and the P-type semiconductor unit 520*a*, a pair of the N-type semiconductor unit 510*b* and the P-type semiconductor unit 520*b*, and a pair of the N-type semiconductor unit 510*c* and the P-type semiconductor unit 520*c*). The N-type semiconductor unit 510*a* and the P-type semiconductor unit 520*a* are disposed on the cold end 121, the N-type semiconductor unit 510*b* and the P-type semiconductor unit 520*b* are disposed on the cold end 122, and the N-type semiconductor unit 510*c* and the P-type semiconductor unit 520*c* are disposed on the cold end 123. It should be noted that the number of thermocouples may be adjusted according to the actual cooling demand, and is not limited to the number shown in FIG. 5.

Figure 6:
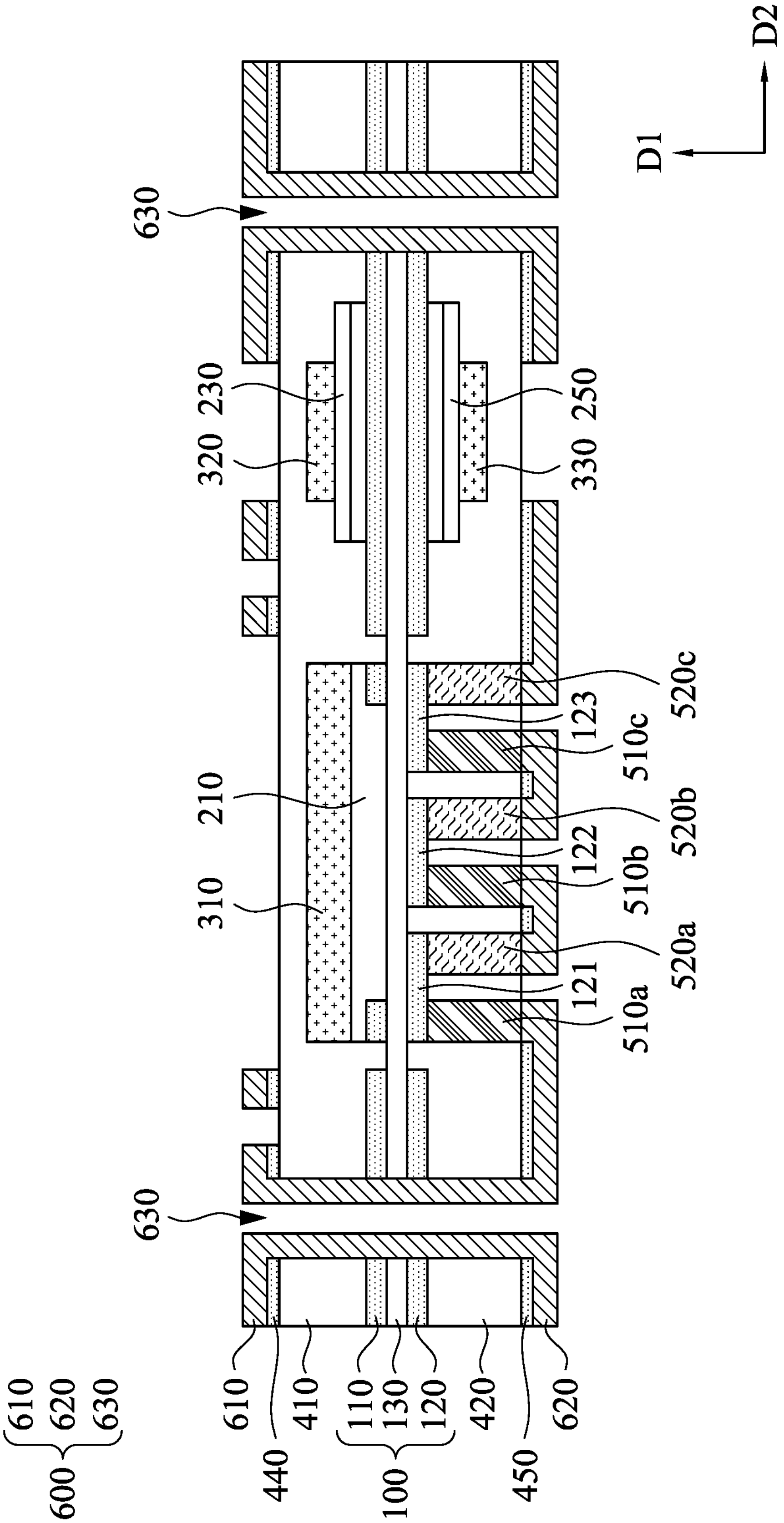

Referring to FIG. 6, a first external structure 610 is formed on the metal layer 440, and a second external structure 620 is formed on the metal layer 450, in which the second external structure 620 electrically connects to the N-type semiconductor units 510*a*, 510*b*, and 510*c* and the P-type semiconductor units 520*a*, 520*b*, and 530*c*. It is understood that the metal layer 440 is used as a seed layer, and the first external structure 610 is electroplated on the metal layer 440. Similarly, the metal layer 450 is used as a seed layer, and the second external structure 620 is electroplated on the metal layer 450.

It is noted that second external structure 620 includes hot ends 621 and 622. It is understood that both of the hot ends 621 and 622 are metal pads of the second external structure 620 at this stage. Specifically, the P-type semiconductor unit 520*a* and the N-type semiconductor unit 510*b* connect to the same hot end 621, the P-type semiconductor unit 520*b* and the N-type semiconductor unit 510*c* connect to the same hot end 622, and the hot end 621 and the hot end 622 are spaced apart from each other. In other words, the N-type semiconductor units 510*a*, 510*b*, and 510*c* and the P-type semiconductor units 520*a*, 520*b*, and 530*c* form a series structure between the cold ends 121, 122, and 123 and the hot ends 621 and 622.

As shown in FIG. 6, in the present embodiment, the first external structure 610, the second external structure 620, and the plated-through hole 630 may be formed by plating copper to form metallic copper layers.

Figure 7:
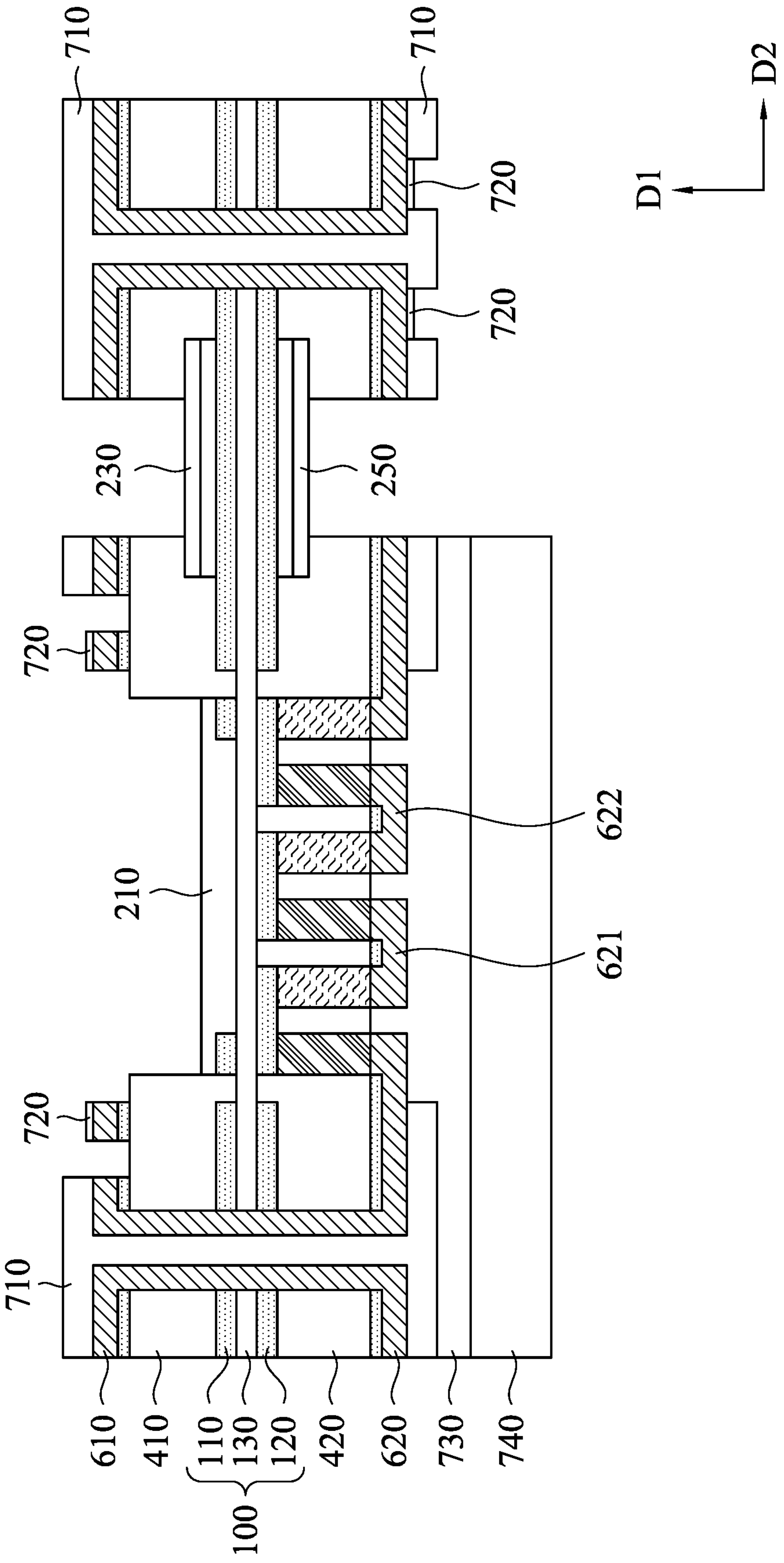

Referring to FIG. 7, a solder mask (SM) layer 710 is formed in the plated-through hole 630 (referring to FIG. 6) and on the first external structure 610 and the second external structure 620. In the present example, the solder mask layer 710 is formed by a printing process and a baking process.

As shown in FIG. 7, after the solder mask layer 710 is formed, a surface treatment is performed on the exposed first external structure 610 to form the protective layer 720. In the present example, the protective layer 720 includes a nickel-gold layer. The protective layer 720 may electrically connect to the underlying first external structure 610 and second external structure 620.

As shown in FIG. 7, after the protective layer 720 is formed, the first peelable glue layer 310 and a portion of the first bonding layer 410 above the first peelable glue layer 310 are removed, and the thermistor layer 210 is exposed. The second peelable glue layer 320 and a portion of the first bonding layer 410 above the second peelable glue layer 320 are removed to expose the first cover layer 230. The third peelable glue layer 330 and a portion of the second bonding layer 420 above the third peelable glue layer are removed to expose the second cover layer 250.

In the present embodiment, the first peelable glue layer 310, the second peelable glue layer 320, and the third peelable glue layer 330 are removed by using a routing process. It is understood that the material of the peelable glue layer has certain viscosity, such that it hardly has residual glue on the underlying film layer when the peelable glue layer is removed.

As shown in FIG. 7, after the thermistor layer 210, the first cover layer 230, and the second cover layer 250 are exposed, a thermal conductive layer 730 is formed on the second external structure 620, in which the second external structure 620 covers portions of the solder mask layer 710. It is understood that the second external structure 620 has hot ends 621 and 622, so the thermal conductive layer 730 covers and connects to the hot ends 621 and 622 and the second bonding layer 420 adjacent to the hot ends 621 and 622.

In the present embodiment, a material of the thermal conductive layer 73 may be silicone. In the present embodiment, the thermal conductive layer 730 is formed by a laminating process.

In the embodiment of FIG. 7, after the thermal conductive layer 730 is formed, a dissipation reinforcing layer 740 is formed on the thermal conductive layer 730. In the present embodiment, the dissipation reinforcing layer 740 is formed by a laminating process.

Figure 8:
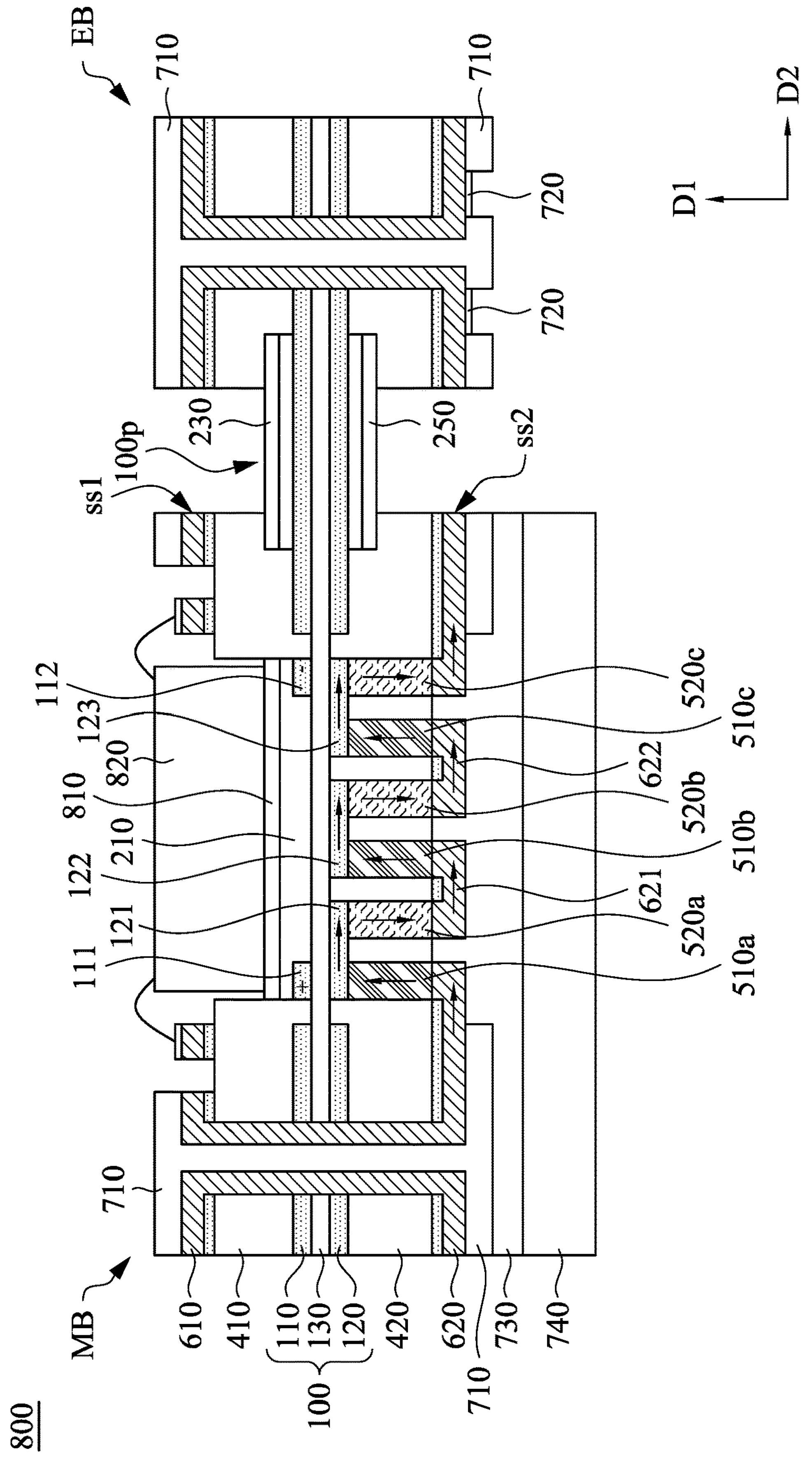

Referring to FIG. 8, a thermal conductive layer 810 is formed on the thermistor layer 210, and an image sensor 820 is disposed on the thermal conductive layer 810. In the present embodiment, the material and forming method of the thermal conductive layer 810 may be the same or similar to the material and forming method of the thermal conductive layer 730. In the present embodiment, the image sensor 820 is disposed by a wire-bonding process. After the image sensor 820 is disposed, bonding wires are formed above the image sensor 820, such that the image sensor 820 is electrically connected to the first external structure 610.

Please refer to FIG. 8 again. The circuit board 800 includes a main board MB and an extending board EB. The internal structure 100 of the main board MB includes a protruding portion 100*p*, and the protruding portion 100*p* is covered by the first cover layer 230 and the second cover layer 250. The protruding portion 100*p* protrudes from a sidewall ss1 of the first external structure 610 and a sidewall ss2 of the second external structure 620. The extending board EB electrically connects to the protruding portion 100*p* of the internal structure 100. It should be noted that the main board MB and the extending board EB are an integrally formed into one substrate, and the substrate is formed through the above-mentioned processes shown in FIG. 1 to FIG. 8. In the present example, the extending board EB includes a data processor and a driving circuit.

As shown in FIG. 8, the main board MB includes the thermistor layer 210, the image sensor 820, and a refrigeration structure. It is understood that the electrodes 111 and 112 are used as the electrodes of the thermistor layer 210. The "refrigeration structure" herein includes N-type semiconductor units 510*a*, 510*b*, and 510*c*, the P-type semiconductor units 520*a*, 520*b*, and 530*c*, the cold ends 121, 122, and 123, and hot ends 621 and 622.

The N-type semiconductor units 510*a*, 510*b*, and 510*c*, the P-type semiconductor units 520*a*, 520*b*, and 530*c* electrically connect to the cold ends 121 and 122 of the second internal circuit layer 120 and the hot ends 621 and 622 of the second external structure 620, such that the refrigeration structure are a series structure. Taking FIG. 8 as an example, the first N-type semiconductor unit 510*a* and the first P-type semiconductor unit 520*a* connect to the same cold end 121, and the first P-type semiconductor unit 520*a* and the second N-type semiconductor unit 510*b* connect to the same hot end 621. Therefore, the ith N-type semiconductor unit (such as the first N-type semiconductor unit 510*a*) and the ith P-type semiconductor unit (such as the first P-type semiconductor unit 520*a*) connects to the same cold end (such as the cold end 121), and the ith P-type semiconductor unit (such as the first P-type semiconductor unit 520*a*) and the (i+1)th N-type semiconductor unit (such as the second N-type semiconductor unit 510*b*) connect to the same hot end (such as the hot end 621), where i is a positive integer.

The disclosed extending board EB may be used as a central controller, which may determine the current magnitude flowing through the refrigeration structure according to the temperature information (for example, the temperature of the image sensor 820 measured by the thermistor layer 210).

The disclosed thermistor layer 210 is embedded in the first bonding layer 410, and the refrigeration structure is embedded in the second bonding layer 420, in which the thermistor layer 210 connects to the cold ends 121 and 122. The thermistor layer 210 is used to monitor the temperature of the upper image sensor 820 and transmits the monitored temperature to the extending board EB, and then the extending board EB uses a data processor to determine the current magnitude flowing through the refrigeration structure.

Referring to arrows of the refrigeration structure shown in FIG. 8, which represent current flow directions of the refrigeration structure. When the current flows from the N-type semiconductor units 510*a*, 510*b*, and 510*c* to the P-type semiconductor units 520*a*, 520*b*, and 530*c*, the joints above are cold ends 121, 122, and 123. When the current flows from the P-type semiconductor units 520*a*, 520*b*, and 530*c* to the N-type semiconductor units 510*a*, 510*b*, and 510*c*, the joints below are hot ends 621 and 622. The cold ends 121, 122, and 123 exchange the heat energy of the image sensor 820 by means of conduction through the insulating layer 130, the thermistor layer 210, and the thermal conductive layer 810. The thermal conductive layer 730 and the dissipation reinforcing layer 740 dissipate the heat energy of the hot ends 621 and 622 by means of conduction.

Based on the above, the provided circuit board of the present invention has the refrigeration structure. The refrigeration structure can adjust the cooling effect according to the demand, and the cold ends of the refrigeration structure can remove the heat energy of the image sensor. Therefore, the heat energy of the circuit board can be effectively dissipated.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit board, comprising:

a main board, comprising:

a first external structure;

a second external structure; and an internal structure disposed between the first external structure and the second external structure, wherein the internal structure, the first external structure, and the second external structure are stacked along a first direction, wherein the internal structure includes:

a first internal circuit layer;

a second internal circuit layer; and an insulating layer disposed between the first internal circuit layer and the second internal circuit layer, wherein the insulating layer, the first internal circuit layer, and the second internal circuit layer are stacked along the first direction;

a first bonding layer disposed between the internal structure and the first external structure, wherein the first bonding layer connects to the internal structure and the first external structure;

a second bonding layer disposed between the internal structure and the second external structure, wherein the second bonding layer connects to the internal structure and the second external structure;

a thermistor layer embedded in the first bonding layer and disposed on the insulating layer and the first internal circuit layer, wherein the thermistor layer directly contacts the insulating layer;

a plurality of N-type semiconductor units and a plurality of P-type semiconductor units, wherein the N-type semiconductor units and the P-type semiconductor units are embedded in the second bonding layer and electrically connect to the second internal circuit layer and the second external structure, wherein the N-type semiconductor units and the P-type semiconductor units alternately arrange along a second direction perpendicular to the first direction, and an orthogonal projection of the N-type semiconductor units and the P-type semiconductor units on the insulating layer overlaps an orthogonal projection of the thermistor layer on the insulating layer;

a first thermal conductive layer disposed on the thermistor layer; and a second thermal conductive layer disposed on the second external structure, wherein the second thermal conductive layer directly contacts the second external structure and the second bonding layer.

2. The circuit board of claim 1, wherein the second internal circuit layer comprises a plurality of cold ends, and the second external structure comprises a plurality of hot ends, wherein an ith N-type semiconductor unit is adjacent to an ith P-type semiconductor unit, the ith N-type semiconductor unit and the ith P-type semiconductor unit connect to a same cold end, and the ith P-type semiconductor unit and a (i+1)th N-type semiconductor unit connect to a same hot end, where i is a positive integer.

3. The circuit board of claim 1, wherein the N-type semiconductor units and the P-type semiconductor units electrically connect to the second external structure.

4. The circuit board of claim 3, further comprising:

a dissipation reinforcing layer disposed on the second thermal conductive layer.

5. The circuit board of claim 1, further comprising:

an image sensor disposed on the first thermal conductive layer.

6. The circuit board of claim 1, wherein a protruding portion of the internal structure protrudes from a sidewall of the first external structure and a sidewall of the second external structure, wherein the main board further comprising:

a first cover layer covering the protruding portion of the internal structure; and a second cover layer covering the protruding portion of the internal structure;

wherein the circuit board further comprising:

an extending board, wherein the extending board electrically connects to the protruding portion of the internal structure.

7. The circuit board of claim 6, wherein the extending board comprises a data processor and a driving circuit.

8. The circuit board of claim 1, further comprising:

a solder mask layer disposed on the first external structure and on the second external structure.

9. The circuit board of claim 1, further comprising:

a protecting layer on the first external structure, wherein the protecting layer includes a nickel-gold layer.

* * * * *